United States Patent
Drost et al.

(10) Patent No.: US 7,369,726 B2
(45) Date of Patent: May 6, 2008

(54) OPTICAL COMMUNICATION BETWEEN FACE-TO-FACE SEMICONDUCTOR CHIPS

(75) Inventors: Robert J. Drost, Mountain View, CA (US); William S. Coates, Los Gatos, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 241 days.

(21) Appl. No.: 10/816,762

(22) Filed: Apr. 2, 2004

(65) Prior Publication Data

US 2004/0197046 A1 Oct. 7, 2004

Related U.S. Application Data

(60) Provisional application No. 60/460,104, filed on Apr. 2, 2003.

(51) Int. Cl.
*G02B 6/26* (2006.01)
*H04B 10/08* (2006.01)
*H04B 10/12* (2006.01)

(52) U.S. Cl. ................ 385/42; 398/156; 398/164
(58) Field of Classification Search ............ 385/14, 385/31, 42; 398/156, 164
See application file for complete search history.

(56) References Cited

U.S. PATENT DOCUMENTS

| | | | |
|---|---|---|---|
| 4,281,253 A | 7/1981 | Culver | 250/551 |
| 5,038,354 A * | 8/1991 | Yagi | 372/44.01 |
| 5,237,434 A | 8/1993 | Feldman et al. | 359/19 |
| 5,629,838 A | 5/1997 | Knight et al. | 361/782 |
| 5,857,042 A | 1/1999 | Robertson et al. | 385/33 |
| 6,374,012 B1 * | 4/2002 | Bergmann et al. | 385/33 |
| 6,728,113 B1 | 4/2004 | Knight et al. | 361/760 |
| 6,916,719 B1 | 7/2005 | Knight et al. | 438/381 |
| 2003/0016920 A1 * | 1/2003 | Sohmura et al. | 385/88 |
| 2003/0039455 A1 * | 2/2003 | Ouchi | 385/88 |

OTHER PUBLICATIONS

Publication entitled "Optical Receivers for Optoelectronic VLSI" by Ted K. Woodward et al., IEEE Journal of Selected Topics in Quantum Electronics, vol. 2. No. 1, Apr. 1996, pp. 106-116.
Publication entitled "16×16 VCSEL Array Flip-Chip Bonded to CMOS VLSI Circuit", by A.V. Krishnamoorthy et al., IEEE Photonics Technology Letters, vol. 12, No. 8, Aug. 2000, pp. 1073-1075.

(Continued)

*Primary Examiner*—Michelle R. Connelly-Cushwa
*Assistant Examiner*—Jerry T. Rahll
(74) *Attorney, Agent, or Firm*—Park, Vaughan & Fleming LLP

(57) ABSTRACT

One embodiment of the present invention provides a system that communicates between a first semiconductor die and a second semiconductor die through optical signaling. During operation, the system converts an electrical signal into an optical signal using an electrical-to-optical transducer located on a face of the first semiconductor die, wherein the first semiconductor die and the second semiconductor die are oriented face-to-face so that the optical signal generated on the first semiconductor die shines on the second semiconductor die. Upon receiving the optical signal on a face of the second semiconductor die, the system converts the optical signal into a corresponding electrical signal using an optical-to-electrical transducer located on the face of the second semiconductor die.

27 Claims, 6 Drawing Sheets

OTHER PUBLICATIONS

Publication entitled "Interconnect density capabilities of computer generated holograms for optical interconnection of very large scale integrated circuits" by Feldman et al., XP 000033764, Applied Optics, vol. 28, No. 15, Aug. 1, 1989, pp. 3134 to 3137.

* cited by examiner

US 7,369,726 B2

OPTICAL COMMUNICATION BETWEEN FACE-TO-FACE SEMICONDUCTOR CHIPS

RELATED APPLICATION

This application hereby claims priority under 35 U.S.C. 119 to U.S. Provisional Patent Application No. 60/460,104, filed on Apr. 2, 2003, entitled, "Optical Communication for Face to Face Chips," by inventors Robert J. Drost and William C. Coates.

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to techniques for communicating between integrated circuit chips. More specifically, the present invention relates to a method and an apparatus for communicating between integrated circuit chips that are arranged face-to-face through optical signaling.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem creates a bottleneck that continues to grow as semiconductor integration densities continue to increase.

Researchers have begun to investigate alternative techniques for communicating between semiconductor chips. One promising technique involves integrating arrays of capacitive transmitter plates and receiver plates onto semiconductor chips to facilitate inter-chip communication. If a first chip is situated face-to-face with a second chip so that transmitter plates on the first chip are capacitively coupled with receiver plates on the second chip, it becomes possible to transmit signals directly from the first chip to the second chip without having to route the signal through intervening signal lines within a printed circuit board. It is also possible to communicate in a similar manner through inductive coupling by using wire loops to couple magnetic fields between chips.

Unfortunately, both capacitive and inductive coupling mechanisms decrease in strength by approximately the inverse of the distance between the chips. The decreased strength of the received signal reduces robustness of the communication mechanism and increases the complexity, power, and area of the receiver and transmitter circuits. Additionally, capacitive and inductive coupling mechanisms suffer from cross-talk, or destructive coupling, from adjacent channels that increases with the distance between chips. It may consequently be difficult to assemble chips into a system with sufficient precision to allow capacitive and inductive coupling mechanisms to operate effectively.

Hence, what is needed is a method and an apparatus for communicating between semiconductor chips without the above-described problems.

SUMMARY

One embodiment of the present invention provides a system that communicates between a first semiconductor die and a second semiconductor die through optical signaling. During operation, the system converts an electrical signal into an optical signal using an electrical-to-optical transducer located on a face of the first semiconductor die, wherein the first semiconductor die and the second semiconductor die are oriented face-to-face so that the optical signal generated on the first semiconductor die shines on the second semiconductor die. Upon receiving the optical signal on a face of the second semiconductor die, the system converts the optical signal into a corresponding electrical signal using an optical-to-electrical transducer located on the face of the second semiconductor die.

In a variation on this embodiment, after generating the optical signal on the first semiconductor die, the system passes the optical signal through annuli located within metal layers on the first semiconductor die to focus the optical signal onto the second semiconductor die.

In a variation on this embodiment, after generating the optical signal on the first semiconductor die, the system uses a lens to focus the optical signal onto the second semiconductor die.

In a variation on this embodiment, after generating the optical signal on the first semiconductor die, the system uses a mirror to reflect the optical signal, so that the optical signal can shine on the second semiconductor die without the first semiconductor die having to be coplanar with the second semiconductor die.

In a variation on this embodiment, after generating the optical signal on the first semiconductor die, the system passes the optical signal through an interposer sandwiched between the first semiconductor die and the second semiconductor die. This interposer contains one or more waveguides that direct the optical signal, so that the optical signal shines on the second semiconductor die.

In a variation on this embodiment, the electrical-to-optical transducer is a member of a plurality of electrical-to-optical transducers located on the first semiconductor die, and the optical-to-electrical transducer is a member of a plurality of optical-to-electrical transducers located on the first semiconductor die. In this variation, a plurality of optical signals can be transmitted in parallel from the first semiconductor die to the second semiconductor die.

In a further variation, multiple spatially adjacent electrical-to-optical transducers in the plurality of electrical-to-optical transducers transmit the same signal, and electronic steering circuits in the first semiconductor die direct data to the multiple spatially adjacent electrical-to-optical transducers to correct mechanical misalignment in X, Y and Θ coordinates.

In a further variation, multiple spatially adjacent optical-to-electrical transducers in the plurality of optical-to-electrical transducers receive the same signal, and electronic steering circuits in the second semiconductor die direct data from the multiple spatially adjacent optical-to-electrical transducers to correct mechanical misalignment in X, Y and Θ coordinates.

In a variation on this embodiment, the electrical-to-optical transducer can be: a Zener diode, a light emitting diode (LED), a vertical cavity surface emitting laser (VCSEL), or an avalanche breakdown P-N diode.

In a variation on this embodiment, the optical-to-optical transducer can be: a P-N-diode photo-detector, or a P-I-N-diode photo-detector.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Arrangement for Chip-to-Chip Communication

Figure 1:
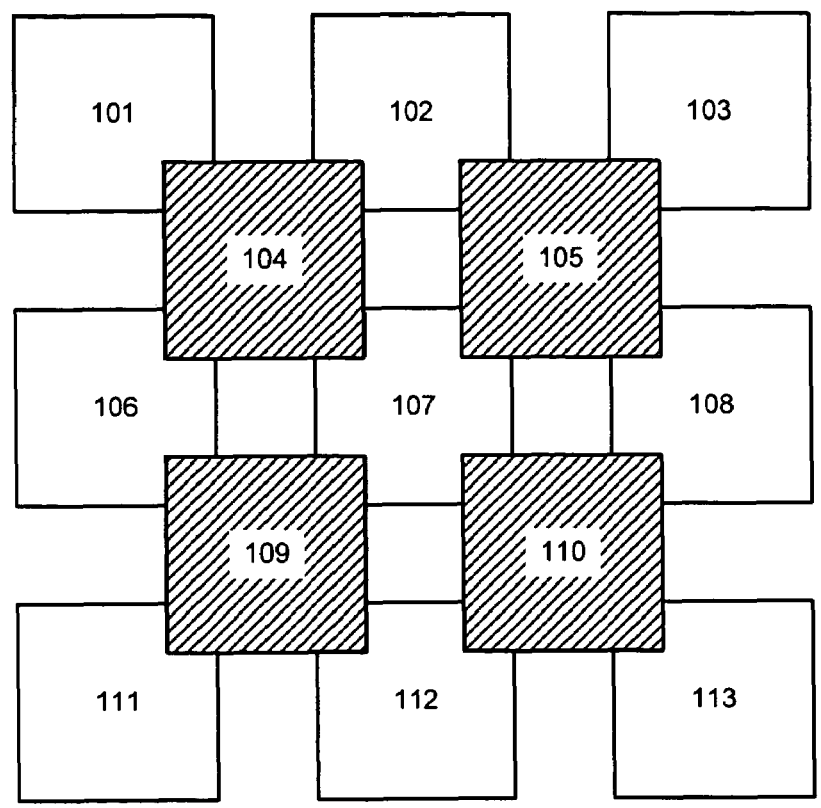
FIG. 1 illustrates a checkerboard pattern for integrated circuit chips that communicate through face-to-face signaling in accordance with an embodiment of the present invention.

In FIG. 1, chips 101-113 are arranged to communicate with each other through face-to-face overlapping regions in their corners. In this arrangement, each chip can communicate with four neighboring chips. Note that many other arrangements that facilitate face-to-face communication will be obvious to a practitioner with ordinary skill in the art.

In one embodiment of the present invention, the arrangement of chips illustrated in FIG. 1 comprises a computer system, where at least one chip, such as chip 104, contains one or more processors, and wherein neighboring chips, 101, 102, 106 and 107, contain circuitry that communicates with the one or more processors in chip 104.

Figure 2A:
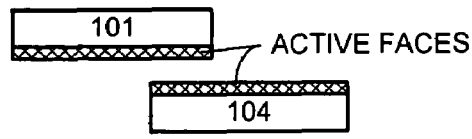
FIG. 2A presents a cross-sectional view of face-to-face chips accordance with an embodiment of the present invention.
Figure 2B:
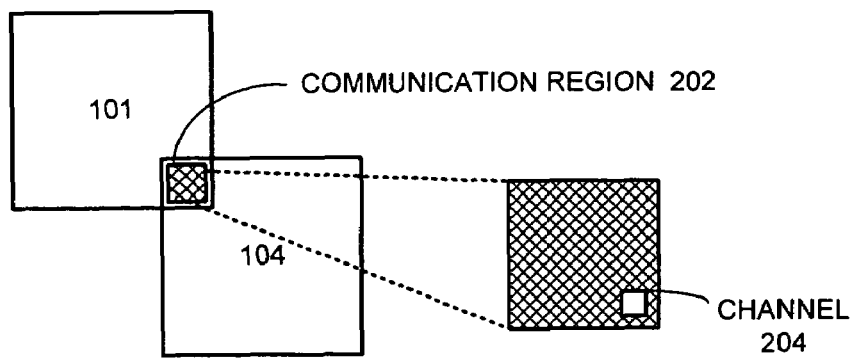
FIG. 2B illustrates a communication region for face-to-face chips accordance with an embodiment of the present invention.

FIGS. 2A and 2B illustrate two chips 101 and 104 that communicate with each other through proximity communication. As is illustrated in FIG. 2A, chips 101 and 104 are positioned so that they overlap with the active face of chip 101 facing the active face of chip 104. (Note that the term "active face" refers to the face of the integrated circuit that contains active circuitry.) The region of overlap is referred to as the "communication region 202" through which transmitter and receiver circuits communicate using optical signals.

As shown in FIG. 2B, communication region 202 comprises a number of communication channels, including channel 204. One motivation for proximity communication is to use modern fine-line chip lithography features to pack transmitter and receiver channels close to one another. Note that off-chip bonding and wiring methods such as wire-bonds, ball grid arrays, and circuit board traces have pitches on the order of 100 microns, whereas on-chip wiring can have pitches of less than micron. Hence, we can pack proximity communication channels on a very tight pitch, for example on the order of 5-30 microns. Packing channels on a tight pitch enables high-bandwidth communication between chips, but also creates challenges in achieving the requisite alignment tolerances.

Figure 3:
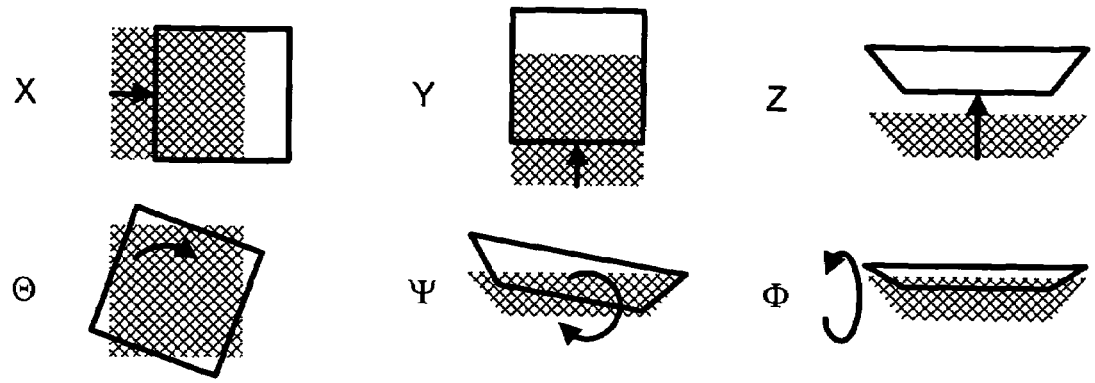
FIG. 3 illustrates six degrees of alignment between semiconductor chips in accordance with an embodiment of the present invention.

FIG. 3 illustrates six coordinates of alignment between the planar surfaces of chip A and chip B. Misalignments in the X, Y, and Θ coordinates cause shifts and rotations between the chips surfaces.

Figure 4:
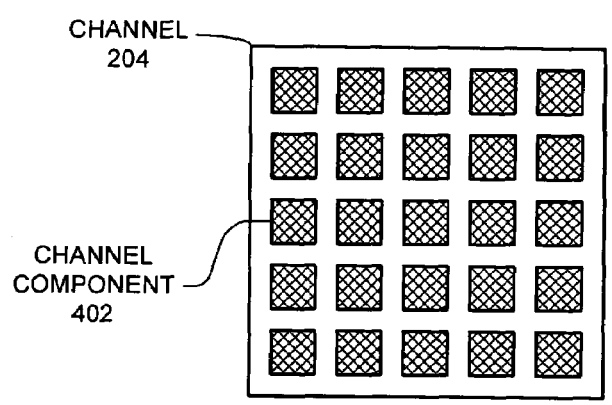
FIG. 4 illustrates how a communication channel can include multiple channel components in accordance with an embodiment of the present invention.

It is possible to correct for mechanical misalignments (shifts or rotations) between the chip's surfaces by subdividing the transmitter, receiver, or both transmitter and receiver for each channel as shown in FIG. 4 into an array of channel components which we "call micro-pads." Electronic steering circuits can then be used to direct data to and from the micro-pads to correct mechanical misalignments in X, Y and Θ coordinates.

However, this technique cannot correct for mechanical misalignment in Z, Ψ, and Φ coordinates. Misalignments in the Z, Ψ, and Φ coordinates cause gaps between the chips that reduced signal strength as the chips become distant. Moreover, cross-talk significantly increases as the chip separation increases.

One embodiment of the present invention uses optical signaling techniques for proximity communication. In contrast to capacitive or inductive coupling techniques, optical signaling techniques can use focused or coherent light that falls off more slowly with Z-distance and causes less crosstalk. Hence, optical signaling can alleviate the sensitivity to gaps, or Z-distance, between the chips.

As illustrated in FIG. 4, a channel 204 may include one or more channel components, such as channel component 402.

More specifically, channel 204 may include one or more electrical-to-optical transducer elements for the transmitter end of the channel, and may include one or more optical-to-electrical transducer elements for the receiver end of the channel. Example electrical-to-optical transducer elements include light-emitting diodes and vertical-cavity surface-emission lasers (VCSELs). Example optical-to-electrical transducer elements include P-N diodes or P-I-N diodes. Standard CMOS fabrication technologies can be used to create light-emitting diodes and P-N diodes. However, VCSELs and P-I-N diodes require fabrication with 3-5 materials such as gallium-arsenide, or special fabrication steps in a CMOS process, respectively.

In order to increase the signal-to-noise ratio it is desirable to direct the light from the transmitter end to the receiver end of the circuit so each channel's optical energy stays mostly within the channel. We refer to this directing process as "focusing" the light.

Figure 5:
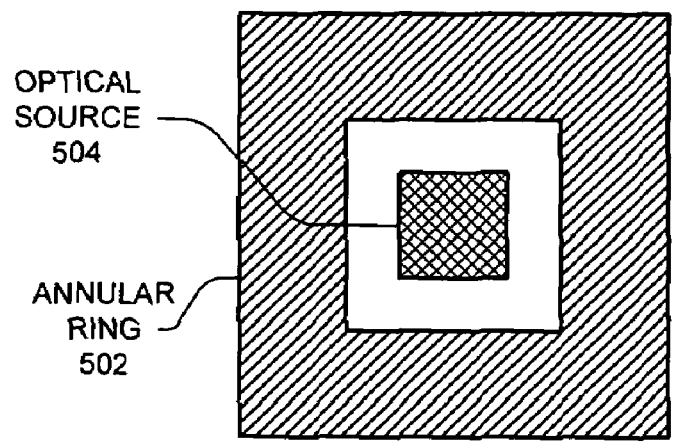
FIG. 5 illustrates an on-chip metal structure that directs an optical beam in accordance with an embodiment of the present invention.
Figure 6:
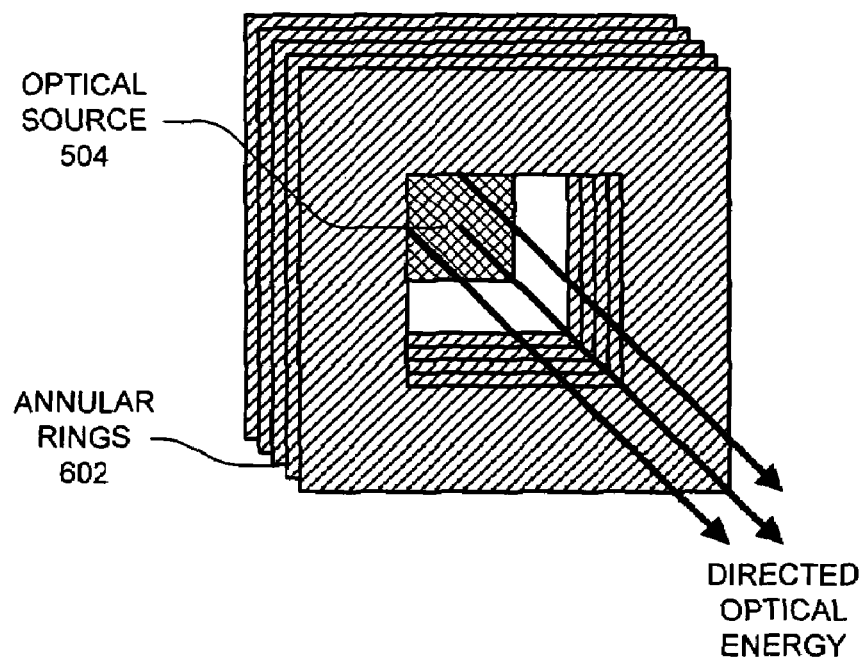
FIG. 6 presents an offset-view of an on-chip metal structure that directs an optical beam in accordance with an embodiment of the present invention.

FIG. 5 illustrates an on-chip mechanism that focuses light. In FIG. 5, an annular ring 502 surrounds a light source 504. Optical energy is directed from light source 504 through a constrained path in the opening of annular ring 502, which reduces transverse spreading of the optical energy. The annular ring structure can be repeated on multiple chip metallization layers to concentrate the beam further as illustrated in FIG. 6.

Figure 7A:
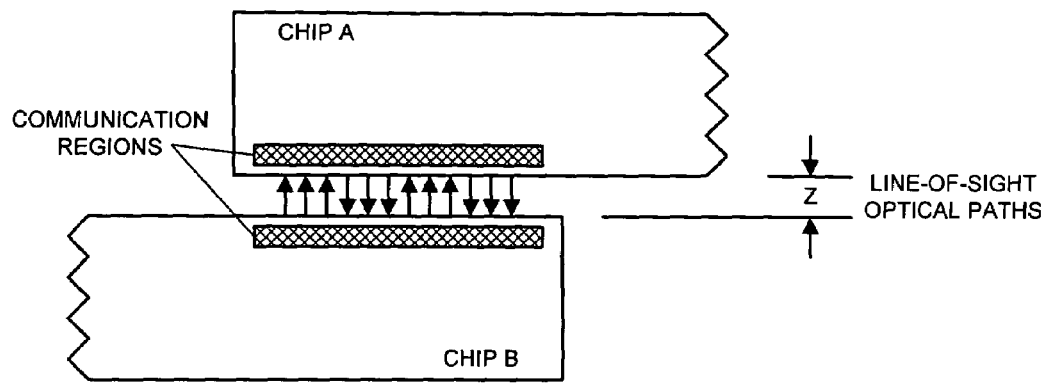
FIG. 7A illustrates line-of-sight optical paths in accordance with an embodiment of the present invention.
Figure 7B:
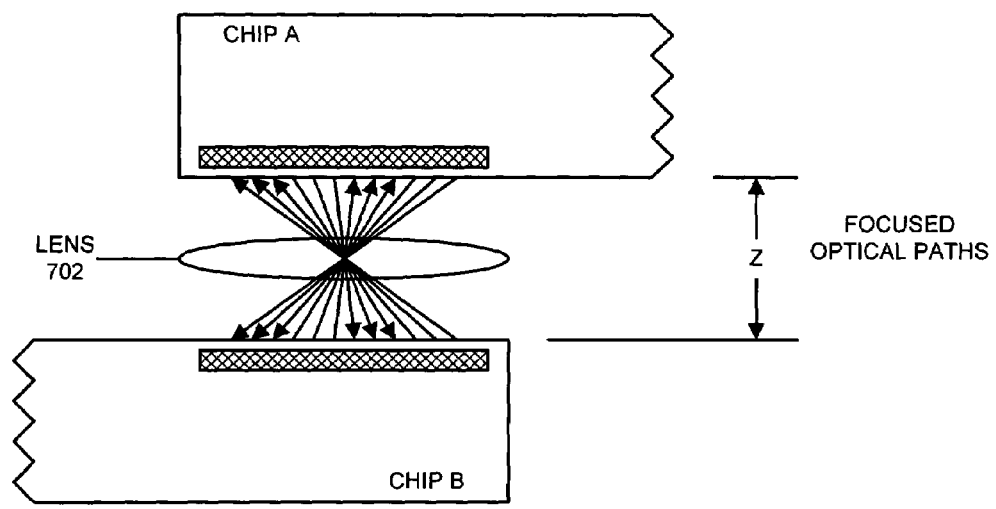
FIG. 7B illustrates focused optical paths in accordance with an embodiment of the present invention.
Figure 7C:
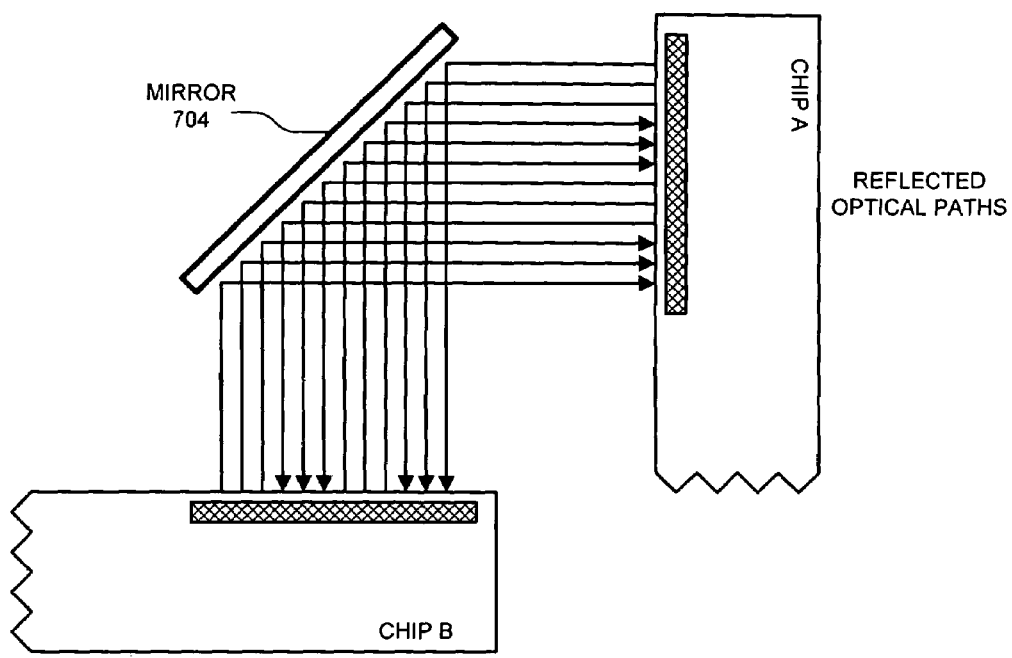
FIG. 7C illustrates reflected optical paths in accordance with an embodiment of the present invention.

FIGS. 7A, 7B and 7C illustrate three off-chip mechanisms for directing light from the transmitter end to the receiver end of the channels. FIG. 7A illustrates line-of-sight optical paths, in which chips are simply aligned so that the transmitted beams of light fall on the receiving structures. FIG. 7B illustrates focused optical paths, in which a lens structure 702 is used to focus the transmitted light. This focused optical path mechanism is more complex, but compensates for spreading of the beam of light. FIG. 7C illustrates a reflected optical path mechanism, which uses a reflector, such as mirror 704, to permit the transmitter end and receiver ends of the channel to be non-coplanar. Note that the reflected path mechanism can be combined with the focused path method.

Figure 8:
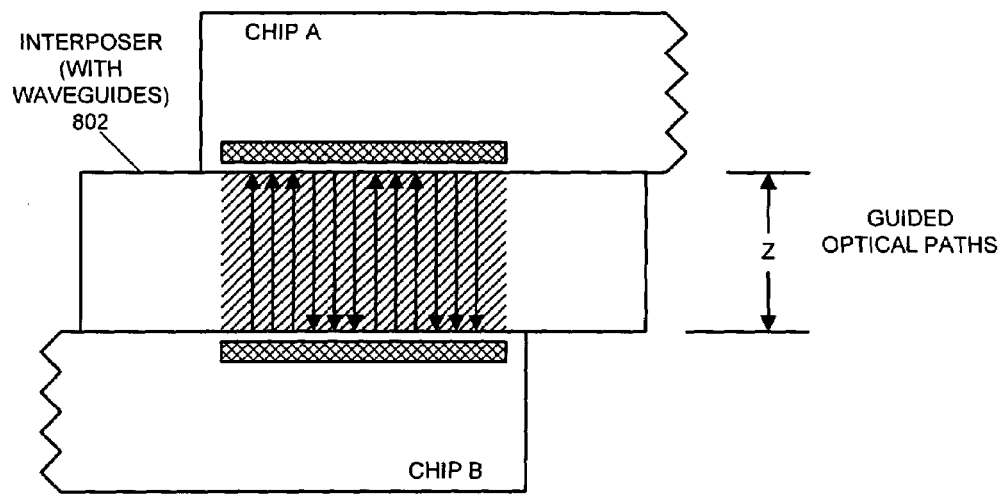
FIG. 8 illustrates an interposer containing an array of wave guides in accordance with an embodiment of the present invention.

Finally, FIG. 8 illustrates another off-chip mechanism that uses an interposer 802, which contains an array of embedded waveguides to direct light from the transmitter end to the receiver end of the channel. A typical optical waveguide includes an optically transparent material with two or more indices of refractivity. The channel in a waveguide has a higher index of refraction that the surrounding cladding material, so that light in the channel reflects off the walls of the waveguide and remains contained in the channel.

Figure 9:
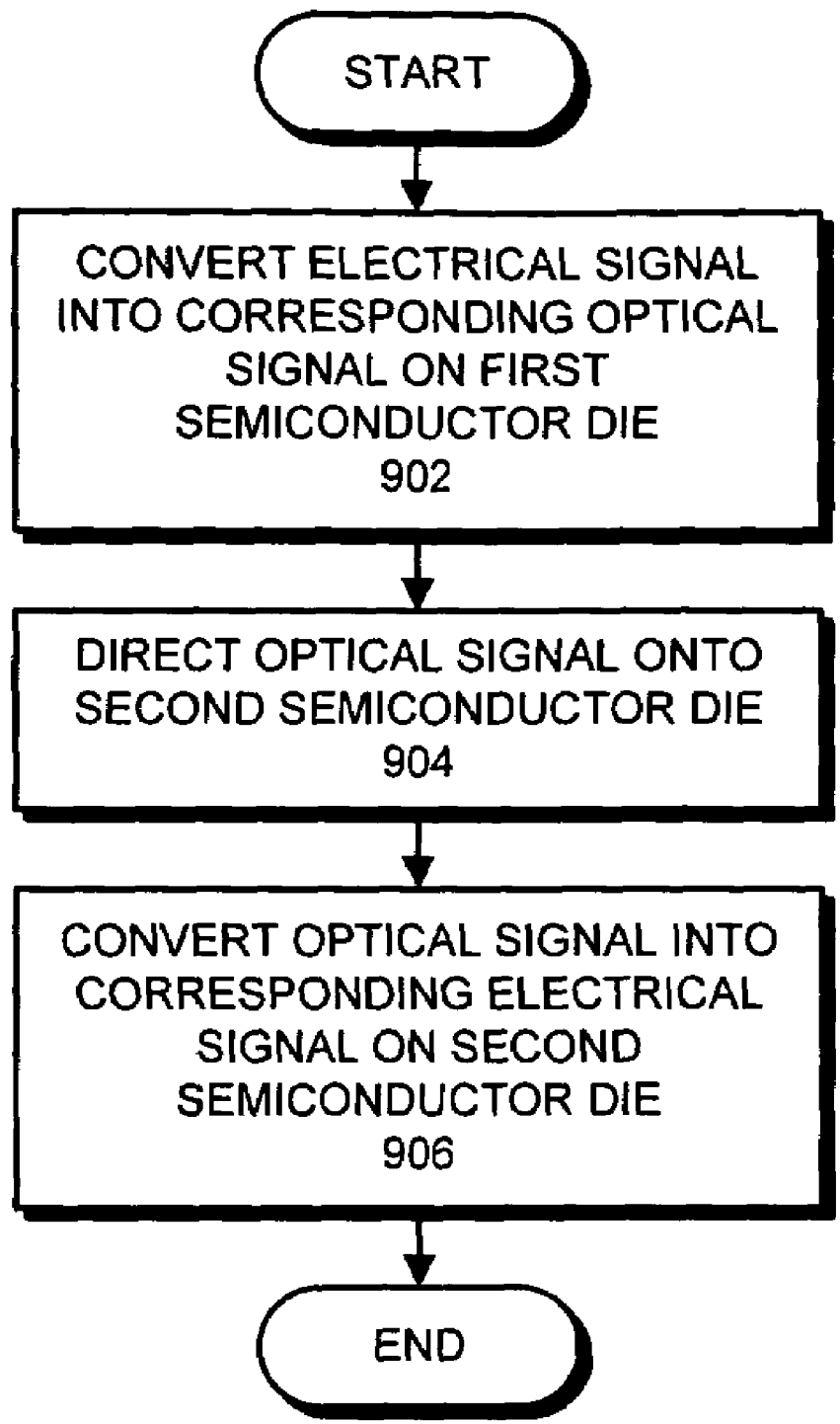
FIG. 9 presents a flow chart illustrating the process of communicating between chips through optical signaling in accordance with an embodiment of the present invention.

FIG. 9 presents a flow chart illustrating the process of communicating between chips through optical signaling in accordance with an embodiment of the present invention. The process starts when an electrical signal is converted into an optical signal through an electrical-to-optical transducer located on a first semiconductor die (step 902). Next, the optical signal is directed onto a second semiconductor die using any of the techniques described above with respect to FIG. 5, FIG. 6, FIGS. 7A-7C and FIG. 8 (step 904). Finally, the optical signal is converted in to a corresponding electrical signal through an optical-to-electrical transducer located on the second semiconductor die (step 906).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for communicating between a first semiconductor die and a second semiconductor die through optical signaling, comprising:
   converting an electrical signal into an optical signal using an electrical-to-optical transducer located on a face of the first semiconductor die;
   wherein the first semiconductor die and the second semiconductor die are oriented face-to-face so that the optical signal generated on the first semiconductor die shines on the second semiconductor die;
   passing the optical signal through annuli repeated on multiple metallization layers on the first semiconductor die to focus the optical signal onto the second semiconductor die;
   receiving the optical signal on a face of the second semiconductor die; and
   converting the optical signal into a corresponding electrical signal using an optical-to-electrical transducer located on the face of the second semiconductor die.

2. The method of claim 1, wherein after generating the optical signal on the first semiconductor die, the method further comprises passing the optical signal through an interposer sandwiched between the first semiconductor die and the second semiconductor die, wherein the interposer contains one or more waveguides that direct the optical signal, so that the optical signal shines on the second semiconductor die.

3. The method of claim 1, wherein after generating the optical signal on the first semiconductor die, the method further comprises using a lens to focus the optical signal onto the second semiconductor die.

4. The method of claim 1, wherein after generating the optical signal on the first semiconductor die, the method further comprises using a mirror to reflect the optical signal, so that the optical signal can shine on the second semiconductor die without the first semiconductor die having to be coplanar with the second semiconductor die.

5. The method of claim 1,
   wherein the electrical-to-optical transducer is a member of a plurality of electrical-to-optical transducers located on the first semiconductor die; and
   wherein the optical-to-electrical transducer is a member of a plurality of optical-to-electrical transducers located on the first semiconductor die;
   whereby a plurality of optical signals can be transmitted in parallel from the first semiconductor die to the second semiconductor die.

6. The method of claim 1, wherein the optical-to-optical transducer includes one of:
   a P-N-diode photo-detector; and
   a P-I-N-diode photo-detector.

7. The method of claim 1,
   wherein multiple spatially adjacent electrical-to-optical transducers in the plurality of electrical-to-optical transducers transmit the same signal; and
   wherein electronic steering circuits in the first semiconductor die direct data to the multiple spatially adjacent electrical-to-optical transducers to correct mechanical misalignment in X, Y and Θ coordinates.

8. The method of claim 1,
   wherein multiple spatially adjacent optical-to-electrical transducers in the plurality of optical-to-electrical transducers receive the same signal; and wherein electronic steering circuits in the second semiconductor die direct data from the multiple spatially adjacent optical-to-electrical transducers to correct mechanical misalignment in X, Y and Θ coordinates.

9. The method of claim 1, wherein the electrical-to-optical transducer includes one of:
   a Zener diode;
   a light emitting diode (LED);
   a vertical cavity surface emitting laser (VCSEL); and
   an avalanche breakdown P-N diode.

10. An apparatus for communicating between semiconductor chips through optical signaling, comprising:
   a first semiconductor die;
   a second semiconductor die;
   an electrical-to-optical transducer located on a face of the first semiconductor die, which is configured to convert an electrical signal into an optical signal;
   wherein the first semiconductor die and the second semiconductor die are oriented face-to-face so that the optical signal generated on the first semiconductor die shines on the second semiconductor die;
   annuli repeated on multiple metallization layers on the first semiconductor die configured to focus the optical signal onto the second semiconductor die;
   an optical-to-electrical transducer located on a face of the second semiconductor die, which is configured to convert the optical signal received from the first semiconductor die into a corresponding electrical signal.

11. The apparatus of claim 10, further comprising an interposer sandwiched between the first semiconductor die and the second semiconductor die, wherein the interposer contains one or more waveguides that direct the optical signal, so that the optical signal shines on the second semiconductor die.

12. The apparatus of claim 10,
   wherein the electrical-to-optical transducer is a member of a plurality of electrical-to-optical transducers located on the first semiconductor die; and
   wherein the optical-to-electrical transducer is a member of a plurality of optical-to-electrical transducers located on the first semiconductor die;
   whereby a plurality of optical signals can be transmitted in parallel from the first semiconductor die to the second semiconductor die.

13. The apparatus of claim 10, further comprising a lens configured to focus the optical signal onto the second semiconductor die.

14. The apparatus of claim 10, further comprising a mirror configured to reflect the optical signal, so that the optical signal can shine on the second semiconductor die without the first semiconductor die having to be coplanar with the second semiconductor die.

15. The apparatus of claim 10,
   wherein multiple spatially adjacent electrical-to-optical transducers in the plurality of electrical-to-optical transducers transmit the same signal; and
   wherein electronic steering circuits in the first semiconductor die direct data to the multiple spatially adjacent electrical-to-optical transducers to correct mechanical misalignment in X, Y and Θ coordinates.

16. The apparatus of claim 10,
   wherein multiple spatially adjacent optical-to-electrical transducers in the plurality of optical-to-electrical transducers receive the same signal; and
   wherein electronic steering circuits in the second semiconductor die direct data from the multiple spatially adjacent optical-to-electrical transducers to correct mechanical misalignment in X, Y and Θ coordinates.

17. The apparatus of claim 10, wherein the electrical-to-optical transducer includes one of:
   a Zener diode;
   a light emitting diode (LED);
   a vertical cavity surface emitting laser (VCSEL); and
   an avalanche breakdown P-N diode.

18. The apparatus of claim 10, wherein the optical-to-optical transducer includes one of:
   a P-N-diode photo-detector; and
   a P-I-N-diode photo-detector.

19. A computer system including semiconductor chips that communicate with each other through optical signaling, comprising:
   a first semiconductor die containing one or more processors;
   a second semiconductor die containing circuitry that communicates with the one or more processors;
   an electrical-to-optical transducer located on a face of the first semiconductor die, which is configured to convert an electrical signal into an optical signal;
   wherein the first semiconductor die and the second semiconductor die are oriented face-to-face so that the optical signal generated on the first semiconductor die shines on the second semiconductor die;
   annuli repeated on multiple metallization layers on the first semiconductor die configured to focus the optical signal onto the second semiconductor die;
   an optical-to-electrical transducer located on a face of the second semiconductor die, which is configured to convert the optical signal received from the first semiconductor die into a corresponding electrical signal.

20. The computer system of claim 19, wherein the optical-to-optical transducer includes one of:
   a P-N-diode photo-detector; and
   a P-I-N-diode photo-detector.

21. The computer system of claim 19, further comprising an interposer sandwiched between the first semiconductor die and the second semiconductor die, wherein the interposer contains one or more waveguides that direct the optical signal, so that the optical signal shines on the second semiconductor die.

22. The computer system of claim 19,
   wherein the electrical-to-optical transducer is a member of a plurality of electrical-to-optical transducers located on the first semiconductor die; and
   wherein the optical-to-electrical transducer is a member of a plurality of optical-to-electrical transducers located on the first semiconductor die;
   whereby a plurality of optical signals can be transmitted in parallel from the first semiconductor die to the second semiconductor die.

23. The computer system of claim 19, further comprising a lens configured to focus the optical signal onto the second semiconductor die.

24. The computer system of claim 19, further comprising a mirror configured to reflect the optical signal, so that the optical signal can shine on the second semiconductor die without the first semiconductor die having to be coplanar with the second semiconductor die.

25. The computer system of claim 19, wherein the electrical-to-optical transducer includes one of:
   a Zener diode;
   a light emitting diode (LED);
   a vertical cavity surface emitting laser (VCSEL); and
   an avalanche breakdown P-N diode.

26. The computer system of claim 19, wherein multiple spatially adjacent optical-to-electrical transducers in the plurality of optical-to-electrical transducers receive the same signal; and wherein electronic steering circuits in the second semiconductor die direct data from the multiple spatially adjacent optical-to-electrical transducers to correct mechanical misalignment in X, Y and Θ coordinates.

27. The computer system of claim 19, wherein multiple spatially adjacent electrical-to-optical transducers in the plurality of electrical-to-optical transducers transmit the same signal; and wherein electronic steering circuits in the first semiconductor die direct data to the multiple spatially adjacent electrical-to-optical transducers to correct mechanical misalignment in X, Y and Θ coordinates.

* * * * *